(12) United States Patent
Noma

(10) Patent No.: US 7,847,299 B2
(45) Date of Patent: Dec. 7, 2010

(54) SEMICONDUCTOR DEVICE AND METHOD OF MANUFACTURING THE SAME

(75) Inventor: Takashi Noma, Ota (JP)

(73) Assignees: Sanyo Electric Co., Ltd., Osaka (JP); Sanyo Semiconductor Co., Ltd., Gunma (JP)

( * ) Notice: Subject to any disclaimer, the term of this patent is extended or adjusted under 35 U.S.C. 154(b) by 18 days.

(21) Appl. No.: 11/964,519

(22) Filed: Dec. 26, 2007

(65) Prior Publication Data

US 2008/0157098 A1 Jul. 3, 2008

(30) Foreign Application Priority Data

Dec. 27, 2006 (JP) ............... 2006-352250

(51) Int. Cl.
*H01L 31/00* (2006.01)
*H01L 33/00* (2010.01)
*H01L 21/00* (2006.01)

(52) U.S. Cl. .......... 257/80; 257/E21.001; 257/E31.001; 257/E33.001; 438/25

(58) Field of Classification Search .................... 257/80
See application file for complete search history.

(56) References Cited

U.S. PATENT DOCUMENTS

| 6,170,155 | B1 * | 1/2001 | Marion et al. ................. 29/840 |
| 7,365,416 | B2 | 4/2008 | Kawabata et al. |
| 2003/0057423 | A1 * | 3/2003 | Shimoda et al. ............... 257/80 |
| 2004/0262732 | A1 * | 12/2004 | Noma et al. ................. 257/685 |
| 2005/0155699 | A1 * | 7/2005 | Hayashi et al. ............. 156/230 |
| 2007/0045841 | A1 * | 3/2007 | Cho et al. .................... 257/737 |
| 2008/0128914 | A1 * | 6/2008 | Morita et al. ............... 257/773 |

FOREIGN PATENT DOCUMENTS

| CN | 1812088 | 8/2006 |
| JP | 2001-094142 | 4/2001 |
| JP | 2008108764 | * 10/2006 |

* cited by examiner

*Primary Examiner*—Jarrett J Stark
*Assistant Examiner*—Lawrence Tynes, Jr.
(74) *Attorney, Agent, or Firm*—Morrison & Foerster LLP

(57) ABSTRACT

The invention provides a semiconductor device with high reliability and smaller size and a method of manufacturing the same. A light emitting element as a device element is formed on the front surface of a semiconductor substrate, for example. In detail, an N-type semiconductor layer, a P-type semiconductor layer and pad electrodes are formed on the front surface of the semiconductor substrate. A device element receiving light from the light emitting element (e.g. a photodiode element), for example, and pad electrodes are formed on the front surface of another semiconductor substrate. The semiconductor substrates are attached and integrated with an adhesive layer being interposed therebetween. Wiring layers electrically connected to the pad electrodes and wiring layers electrically connected to the other pad electrodes are formed on the side surface of the semiconductor substrate.

9 Claims, 14 Drawing Sheets

SEMICONDUCTOR DEVICE AND METHOD OF MANUFACTURING THE SAME

CROSS-REFERENCE OF THE INVENTION

This application claims priority from Japanese Patent Application No. 2006-352250, the content of which is incorporated herein by reference in its entirety.

BACKGROUND OF THE INVENTION

1. Field of the Invention

The invention relates to a semiconductor device, particularly, a package type semiconductor device and a method of manufacturing the same.

2. Description of the Related Art

Conventionally, there is a case where a device manufactured by electrically connecting a plurality of semiconductor dies by packaging the dies on a circuit board or by making a plurality of semiconductor dies cooperate even though these are not electrically connected.

For example, a conventional photocoupler has a light emitting element 100 as a first semiconductor die and a light receiving element 101 as a second semiconductor die as shown in FIG. 15. The light emitting element 100 and the light receiving element 101 are electrically connected to leads 103 through bonding wires 102. Furthermore, the light emitting element 100 and the light receiving element 101 are sealed with a transparent resin layer 104 and further sealed with mold resin 105 blocking light. It is noted that the light emitting element 100 and the light receiving element 101 are not electrically connected.

In this photocoupler, an inputted electrical signal is converted into a light signal at the light emitting element 100 and this light makes the light receiving element 101 conductive, thereby completing signal transmission.

The relevant technology is described in Japanese Patent Application Publication No. 2001-94142.

In recent years, however, there is a demand for a smaller and thinner semiconductor device. Therefore, the invention provides a semiconductor device with high reliability and smaller size and a method of manufacturing the same.

SUMMARY OF THE INVENTION

The invention is made for solving the above problem and the feature thereof is as follows. The invention provides a semiconductor device including: a first substrate formed with a first device element on its front surface; and a second substrate formed with a second device element on its front surface, wherein the first substrate and the second substrate are attached with the front surfaces facing each other with an adhesive layer being interposed therebetween.

The invention also provides a method of manufacturing a semiconductor device, including: providing a first substrate formed with a first device element on its front surface and a second substrate formed with a second device element on its front surface; attaching the first substrate and the second substrate with the front surfaces facing each other with an adhesive layer being interposed therebetween; and cutting the first and second substrates along a predetermined dicing line to divide these into individual semiconductor dies.

DETAILED DESCRIPTION OF THE INVENTION

A first embodiment of the invention will be described referring to figures. The first embodiment applies the invention to a structure of a photocoupler and a method of manufacturing this photocoupler. FIGS. 1 to 12 are cross-sectional views or plan views shown in order of manufacturing processes.

Figure 1:
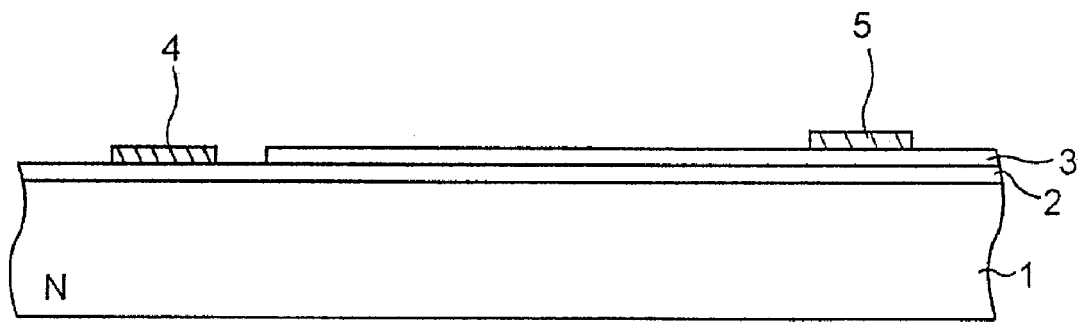
FIG. 1 is a cross-sectional view for explaining a semiconductor device and a method of manufacturing the same of a first embodiment of the invention.

First, a light emitting element portion of the photocoupler is formed. In this embodiment, a light emitting diode (LED) is formed on a semiconductor substrate. As shown in FIG. 1, an N-type semiconductor substrate 1 made of, for example, gallium arsenic (GaAs), gallium nitride (GaN) or the like is prepared. The thickness of the semiconductor substrate 1 is about 300 μm, for example. The semiconductor substrate 1 of this embodiment also has a function of supporting a semiconductor substrate 11. The material of the semiconductor substrate 1 may be changed depending on a desired color of light. Then, an N-type semiconductor layer 2 and a P-type semiconductor layer 3 are formed on the front surface of the semiconductor substrate 1 in this order by an epitaxial crystal growth method. A PN junction region formed by these is to be a light emitting region. An N-type impurity added to the semiconductor substrate 1 and the N-type semiconductor layer 2 is, for example, sulfur (S), selenium (Se), tellurium (Te) and so on. A P-type impurity added to the P-type semiconductor layer 3 is zinc (Zn), for example.

Then, a portion of the P-type semiconductor layer 3 is selectively removed by, for example, a dry-etching method to expose a portion of the N-type semiconductor layer 2 as shown in FIG. 1. Then, a pad electrode 4 (a cathode electrode) and a pad electrode 5 (an anode electrode) are formed on the exposed N-type semiconductor layer 2 and the P-type semiconductor layer 3, respectively. The pad electrodes 4 and 5 are formed by, for example, forming a metal layer of aluminum (Al), copper (Cu) or the like by a thin film formation technique such as a sputtering method and then selectively etching this metal layer using a resist layer (not shown) as a mask.

Then, according to needs, an insulation film covering the whole surface of the semiconductor substrate 1 may be formed by, for example, a CVD method and the insulation film on the pad electrodes 4 and 5 may be removed by a photolithography. It means that the front surfaces of the N-type semiconductor layer 2 and the P-type semiconductor layer 3 may be covered by the insulation film or may be exposed. The description of this embodiment is given assuming that the process of forming this insulation film is not included.

In this manner, the semiconductor substrate 1 where LED as a light emitting element and the pad electrodes 4 and 5 electrically connected with the LED are formed on the front surface is formed. The above description is an example of the method of manufacturing the light emitting element, and the manufacturing process differs depending on required characteristics (e.g. a color of light etc). The light emitting element may be any element as long as it emits light, for example, a laser diode.

Figure 2:
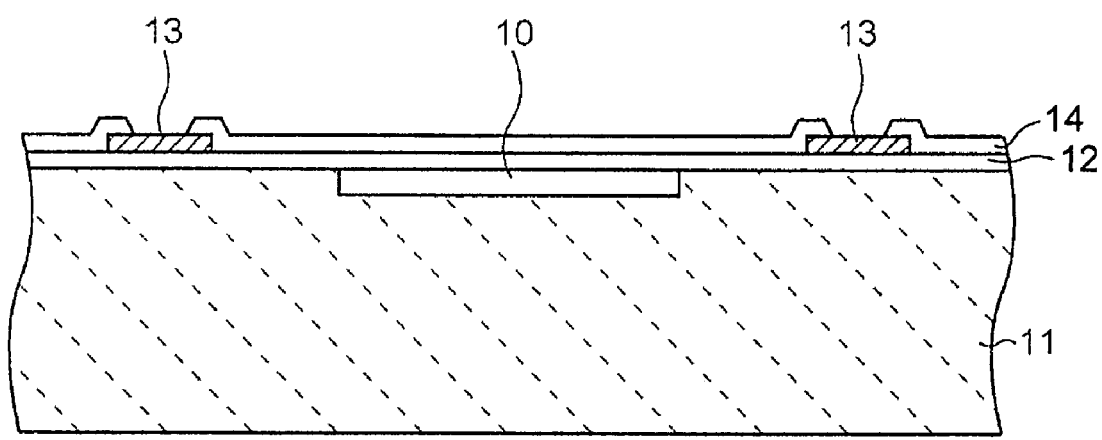
FIG. 2 is a cross-sectional view for explaining the semiconductor device and the method of manufacturing the same of the first embodiment of the invention.

Next, a light receiving element portion of the photocoupler is formed. As shown in FIG. 2, the semiconductor substrate 11 made of silicon (Si) or the like where a device element 10 (e.g. a photodiode element) is formed on the front surface is prepared. The semiconductor substrate 11 has a thickness of, for example, about 300 to 700 µm. Then, a first insulation film 12 (e.g. a silicon oxide film formed by a thermal oxidation method, a CVD method or the like) is formed on the front surface of the semiconductor substrate 11 to have a thickness of, for example, 2 µm.

Then, a metal layer of aluminum (Al), an aluminum alloy, copper (Cu) or the like is formed by a sputtering method, a plating method or other deposition method, and this metal layer is then selectively etched to form pad electrodes 13 having a thickness of 1 µm on the first insulation film 12. The pad electrode 13 is an electrode for external connection which is electrically connected to the device element 10 or other peripheral elements through wires (not shown). In FIG. 2, although the pad electrodes 13 are disposed on the both sides of the device element 10, the position is not limited to this and may be above the device element 10. Alternatively, the pad electrodes 13 may be formed so as to surround the semiconductor device completed finally.

Then, a passivation film 14 (e.g. a silicon nitride film formed by a CVD method) covering the pad electrodes 13 partially or entirely is formed on the front surface of the semiconductor substrate 11. In FIG. 2, the passivation film 14 is formed to partially cover the pad electrodes 13. In this manner, the semiconductor substrate 11 where the device element 10 as a light receiving element and the pad electrodes 13 electrically connected to the device element 10 are formed on the front surface is formed.

Figure 3A:
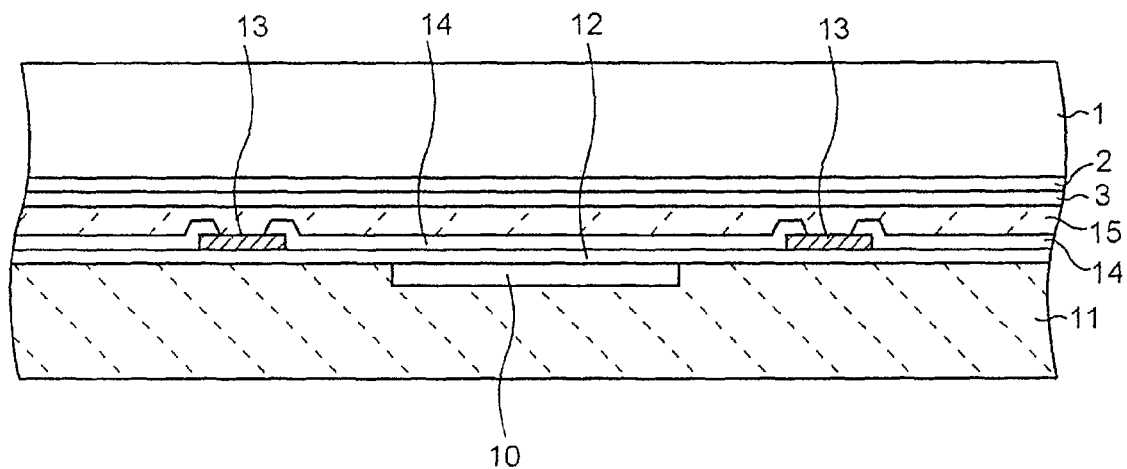
FIGS. 3A and 3B are cross-sectional views for explaining the semiconductor device and the method of manufacturing the same of the first embodiment of the invention.
Figure 3B:
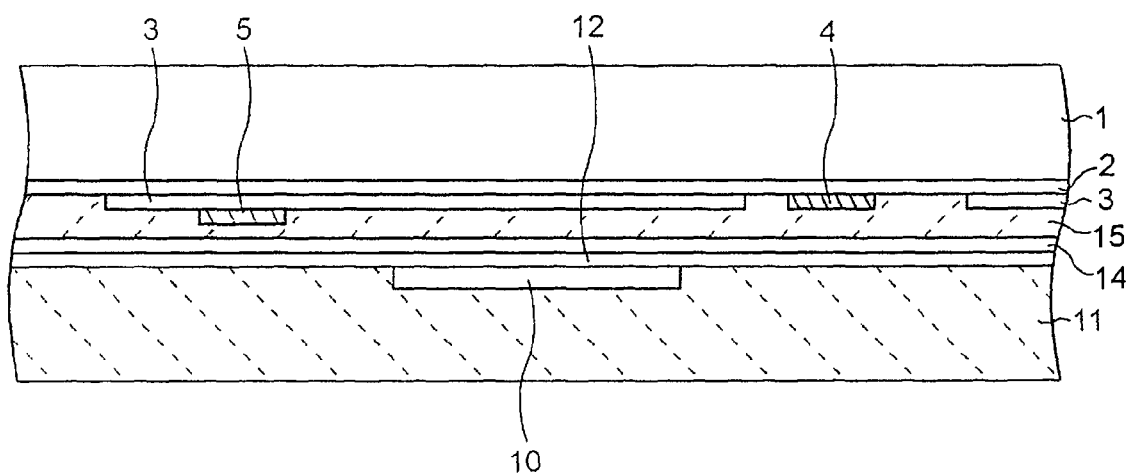

Then, as shown in FIGS. 3A and 3B, the front surface (the element side) of the semiconductor substrate 11 and the front surface (the element side) of the semiconductor substrate 1 are attached with an adhesive layer 15 such as epoxy resin, polyimide (e.g. photosensitive polyimide), resist, acrylic or the like being interposed therebetween. The thickness of the adhesive layer 15 is about several µm to several tens of µm. Therefore, the element (the light emitting element) on the semiconductor substrate 1 and the element (the device element 10) on the semiconductor substrate 11 are adjacent. The adhesive layer 15 of the first embodiment is transparent, and has a property of transmitting light from the described light emitting element. However, the adhesive layer 15 is not necessarily transparent depending on the use of the semiconductor device.

Figure 4:
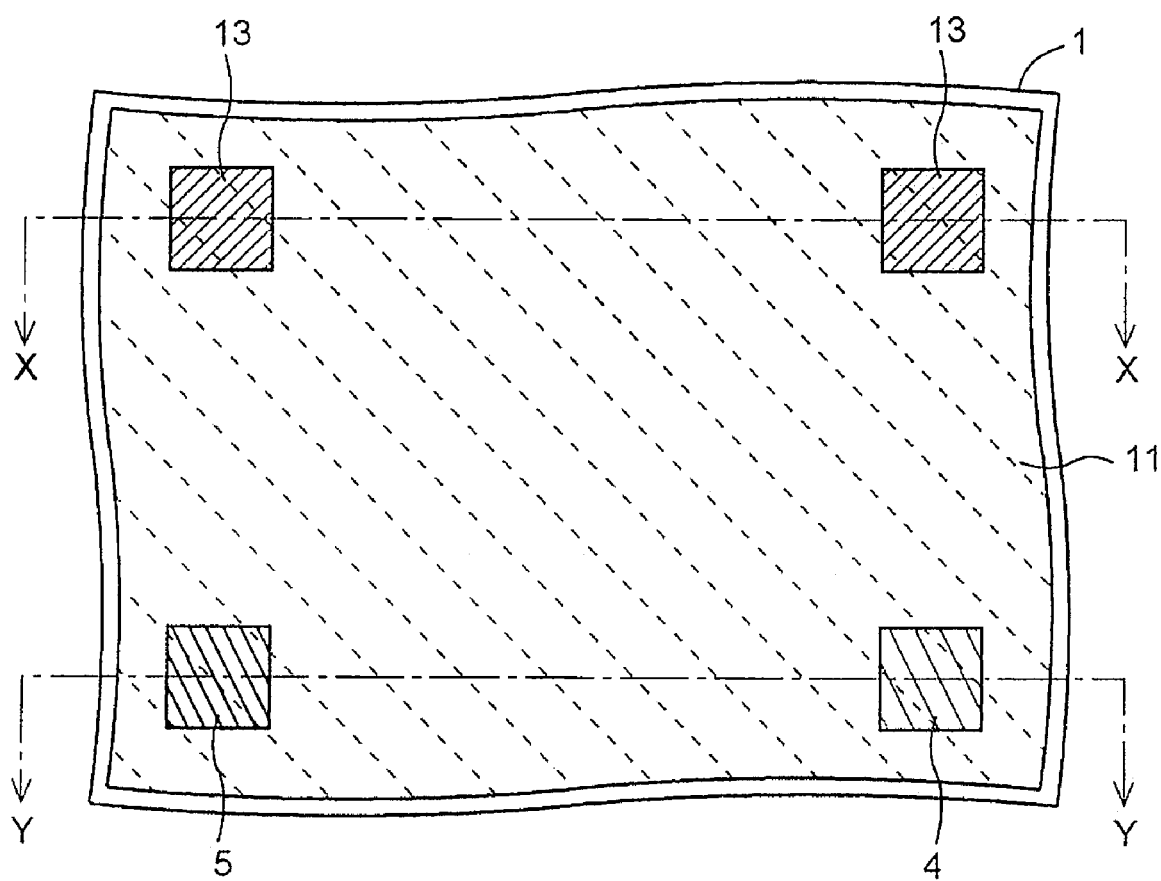
FIG. 4 is a plan view for explaining the semiconductor device and the method of manufacturing the same of the first embodiment of the invention.

The semiconductor substrate 1 and the semiconductor substrate 11 are attached so that the pad electrodes 4 and 5 and the pad electrodes 13 do not overlap as shown in FIG. 4. FIG. 4 is a plan view partially showing the attached surfaces, and FIG. 3A corresponds to a cross-sectional view of FIG. 4 along line X-X and FIG. 3B corresponds to a cross-sectional view along line Y-Y. Hereafter, cross-sectional views such as the likes of FIGS. 3A and 3B are used to explain this embodiment.

Then, back-grinding is performed to the back surface of the semiconductor substrate 11 using a back surface grinder to thin the semiconductor substrate 11 into a predetermined thickness (e.g. about 100 µm). When the semiconductor substrate 11 is thinned by the back-grinding, it is likely that warping or breaking occurs due to reduced strength during carriage in the manufacturing processes. For preventing this, it is preferable to form the semiconductor substrate 1 thicker than the semiconductor substrate 11 after the back-grinding. In other words, it is preferable that the substrate which will not be formed with an opening 16 or wiring layers 18 and 19 is formed thicker than the substrate which will be formed with these. The grinding process may be an etching process, or a combination of the grinder and the etching process. There is also a case where the grinding process is not necessary depending on the application or specification of an end-product and the initial thickness of the provided semiconductor substrate 11. According to needs, the same grinding process may be performed to the back surface of the semiconductor substrate 1.

Furthermore, since the grinding process may cause a rough ground surface, a wet etching process may be performed as a process for obtaining a flat surface after the grinding process, for example.

Figure 5A:
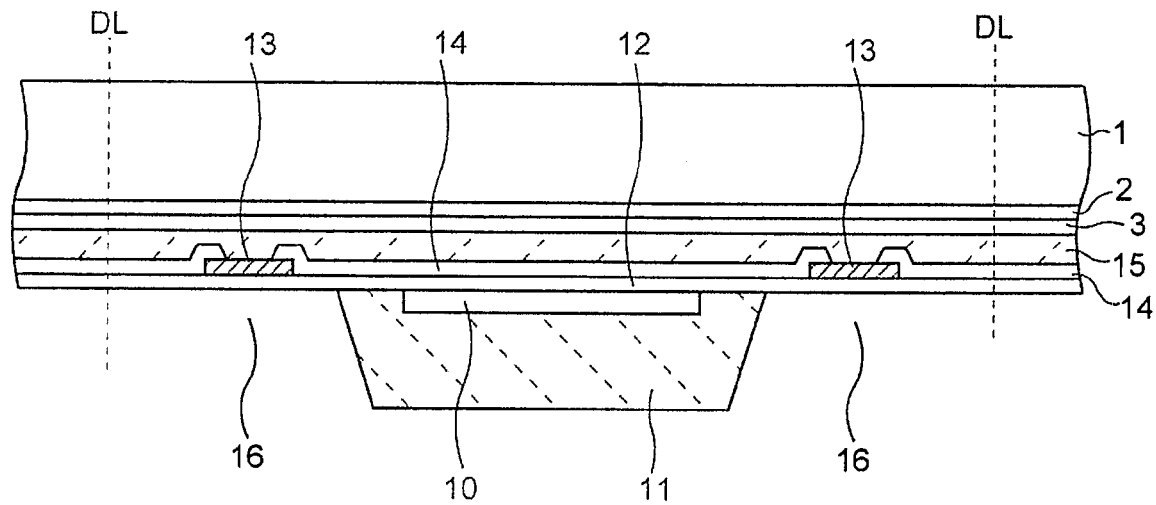
FIGS. 5A and 5B are cross-sectional views for explaining the semiconductor device and the method of manufacturing the same of the first embodiment of the invention.
Figure 5B:
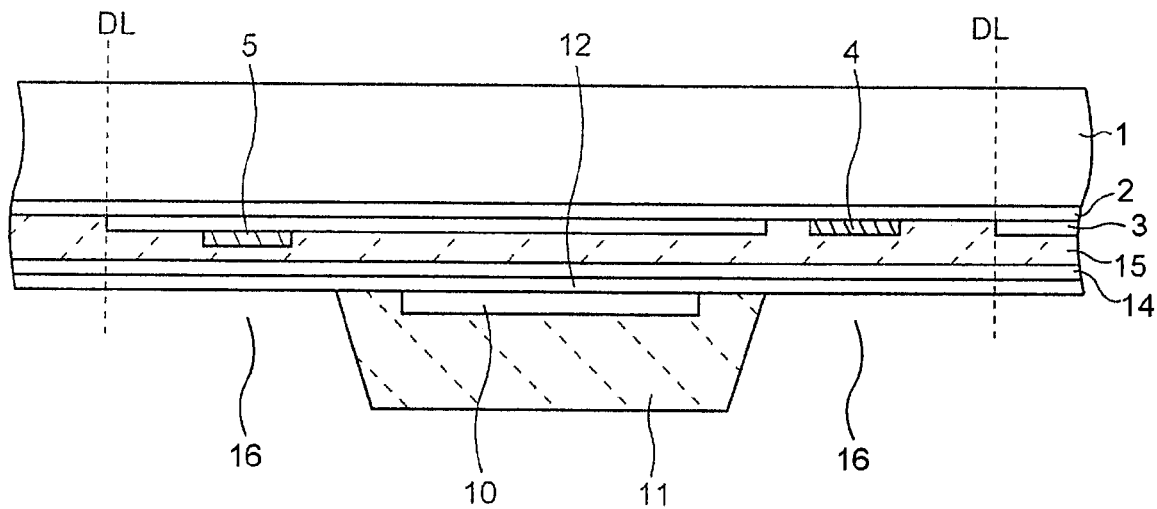

Then, as shown in FIGS. 5A and 5B, the semiconductor substrate 11 is selectively etched in a predetermined region corresponding to the pad electrodes 4, 5 and 13 from its back surface to expose a portion of the first insulation film 12. Hereafter, this exposed portion is referred to as the opening 16.

Figure 6A:
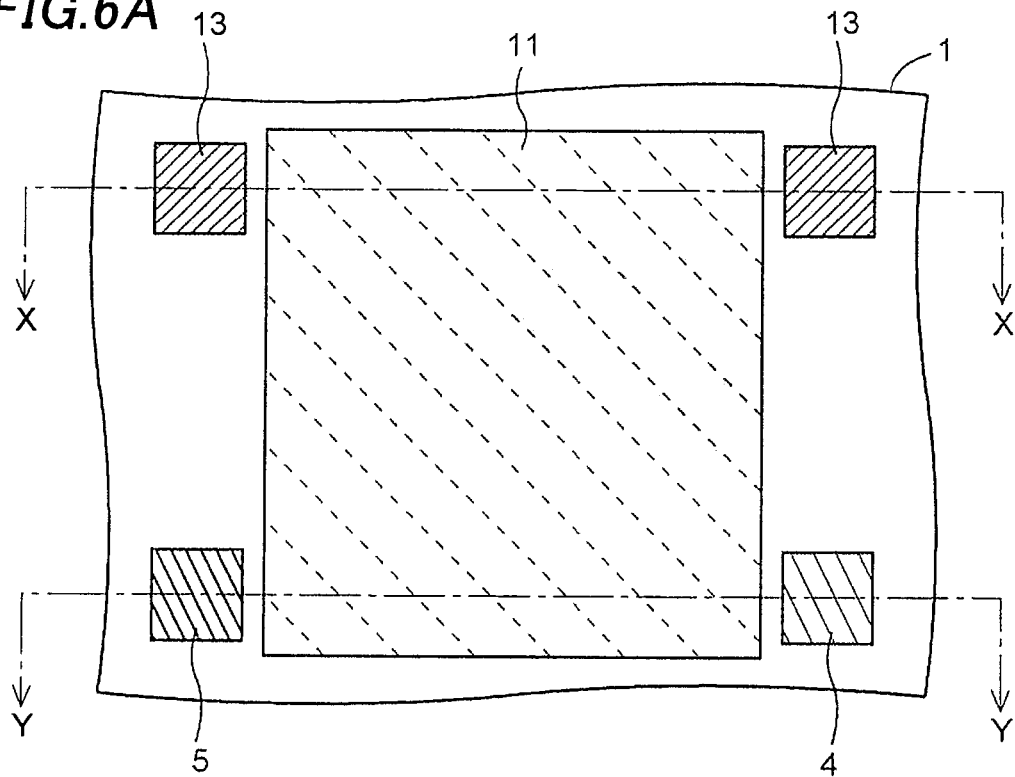
FIGS. 6A and 6B are plan views for explaining the semiconductor device and the method of manufacturing the same of the first embodiment of the invention.
Figure 6B:
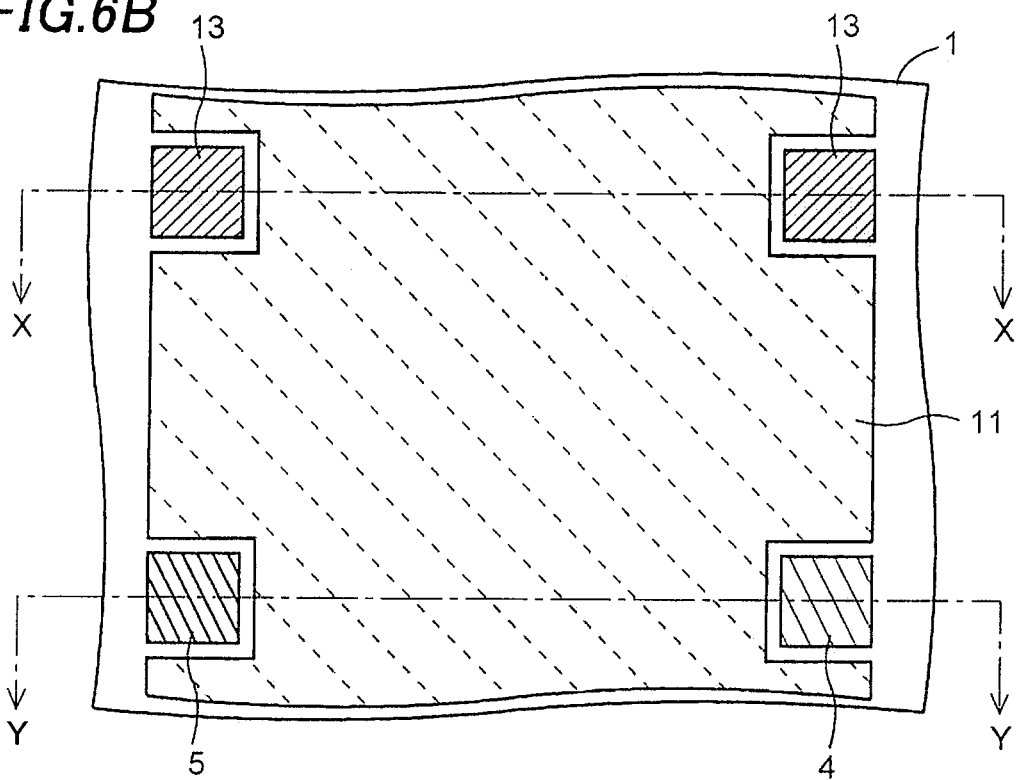

The selective etching of the semiconductor substrate 11 will be described referring to FIGS. 6A and 6B. FIGS. 6A and 6B are schematic plan views of a portion of the wafer on the semiconductor substrate 11 side, and FIG. 5A corresponds to a cross-sectional view of each of FIGS. 6A and 6B along lines X-X and FIG. 5B corresponds to a cross-sectional view of each of FIGS. 6A and 6B along lines Y-Y.

As shown in FIG. 6A, the semiconductor substrate 11 may be etched into an almost rectangular shape smaller than the semiconductor substrate 1. Alternatively, as shown in FIG. 6B, the semiconductor substrate 11 may be etched only in a region formed with the pad electrodes 4, and 13 so as to have an uneven periphery. The latter provides the larger overlapping area between the semiconductor substrate 11 and the semiconductor substrate 1 and the semiconductor substrate 11 remains near the periphery of the semiconductor substrate 1. Therefore, the latter structure is preferable for enhancing the bonding strength of the semiconductor substrate 11 and the semiconductor substrate 1. Furthermore, since the latter structure prevents the semiconductor substrate 1 and the semiconductor substrate 11 from warping due to the difference in coefficient of thermal expansion between the semiconductor substrate 1 and the semiconductor substrate 11, cracking or separation in the semiconductor device is prevented. It is noted that the semiconductor substrate 11 may be designed into other plane shape than the shapes shown in FIGS. 6A and 6B.

Furthermore, although the sidewall of the semiconductor substrate 11 is etched obliquely so that the width of the semiconductor substrate 11 is wider on the front surface side in this embodiment as shown in FIGS. 5A and 5B, the semiconductor substrate 11 may be etched to form the sidewall perpendicular to the main surface of the semiconductor substrate 1.

Figure 7A:
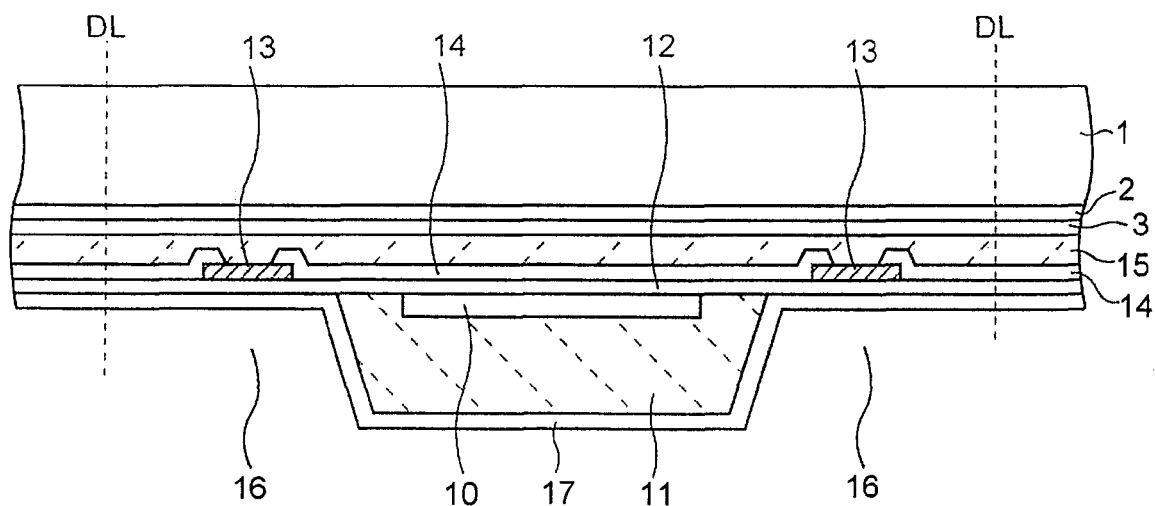
FIGS. 7A and 7B are cross-sectional views for explaining the semiconductor device and the method of manufacturing the same of the first embodiment of the invention.
Figure 7B:
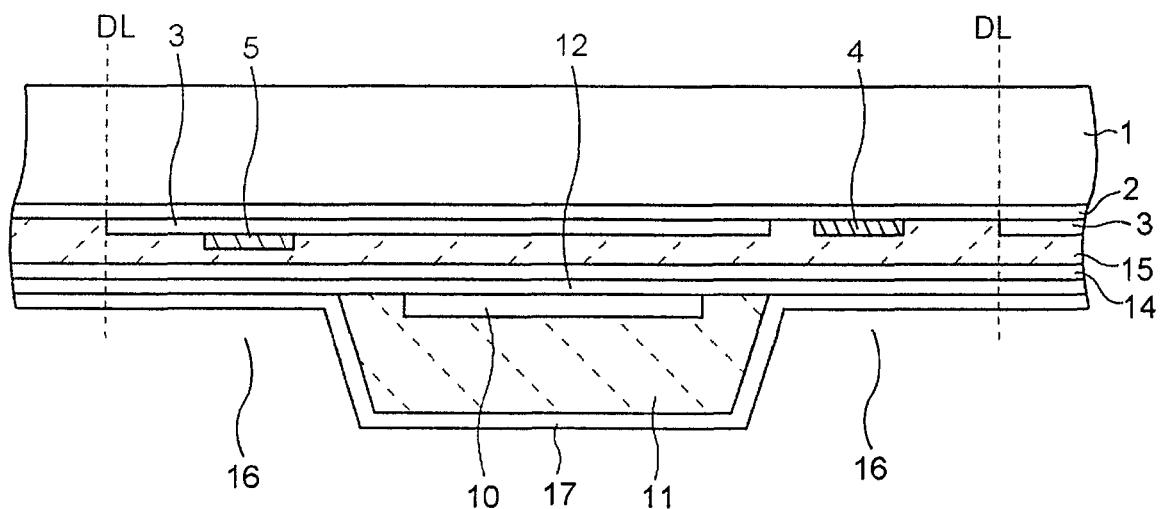

Then, as shown in FIGS. 7A and 7B, a second insulation film 17 is formed in the opening 16 and on the back surface of the semiconductor substrate 11. This second insulation film 17 is an insulation film such as a silicon oxide film or a silicon nitride film formed by a plasma CVD method, for example.

Figure 8A:
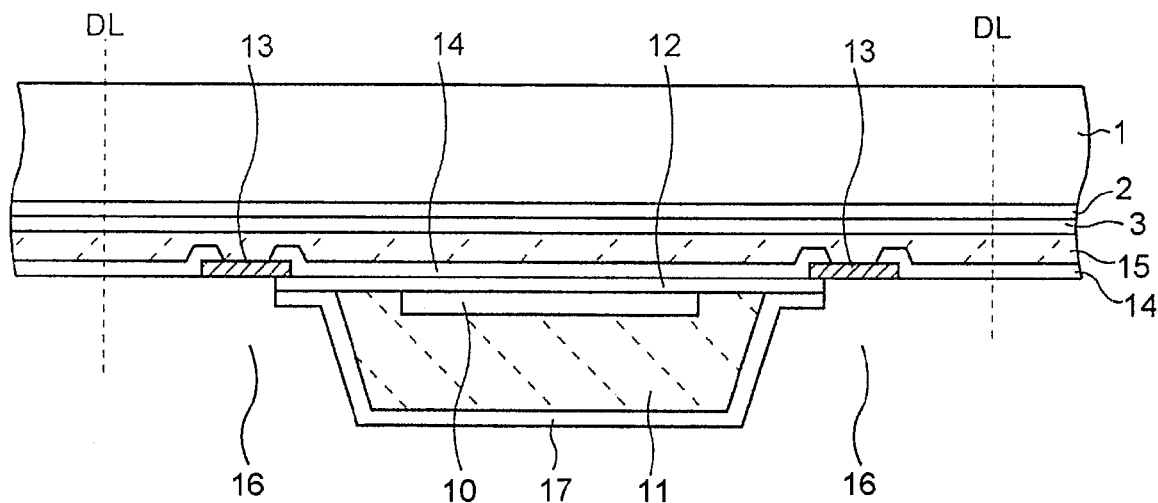
FIGS. 8A and 8B are cross-sectional views for explaining the semiconductor device and the method of manufacturing the same of the first embodiment of the invention.
Figure 8B:
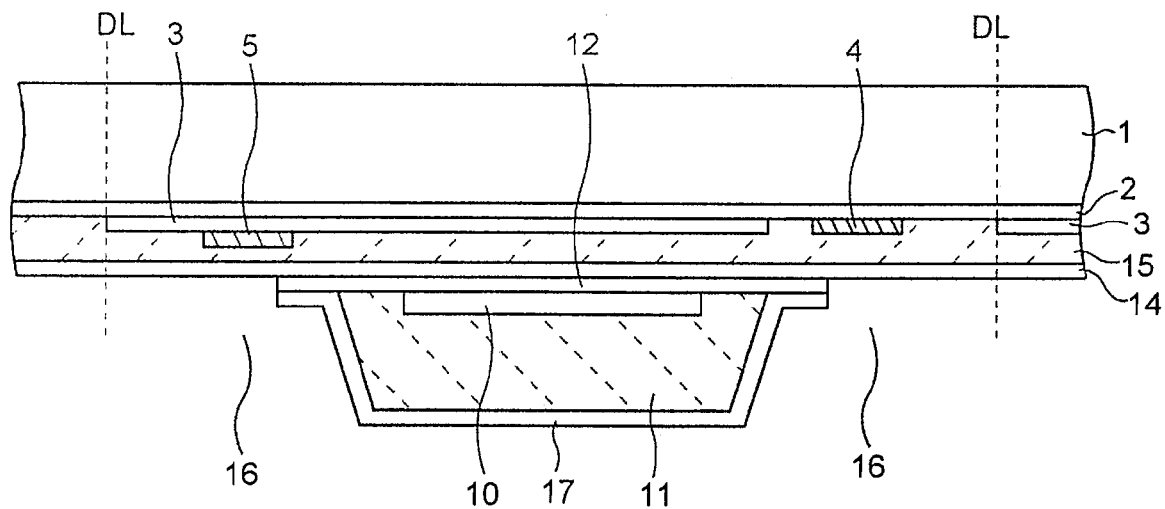

Then, as shown in FIGS. 8A and 8B, the first insulation film 12 and the second insulation film 17 are selectively etched using a resist layer (not shown) as a mask. By this etching, the first insulation film 12 and the second insulation film 17 formed in regions from a portion of the pad electrodes 4, 5 and 13 to the dicing lines DL are removed to expose at least a portion of each of the pad electrodes 13 on the bottom of the opening 16.

Figure 9A:
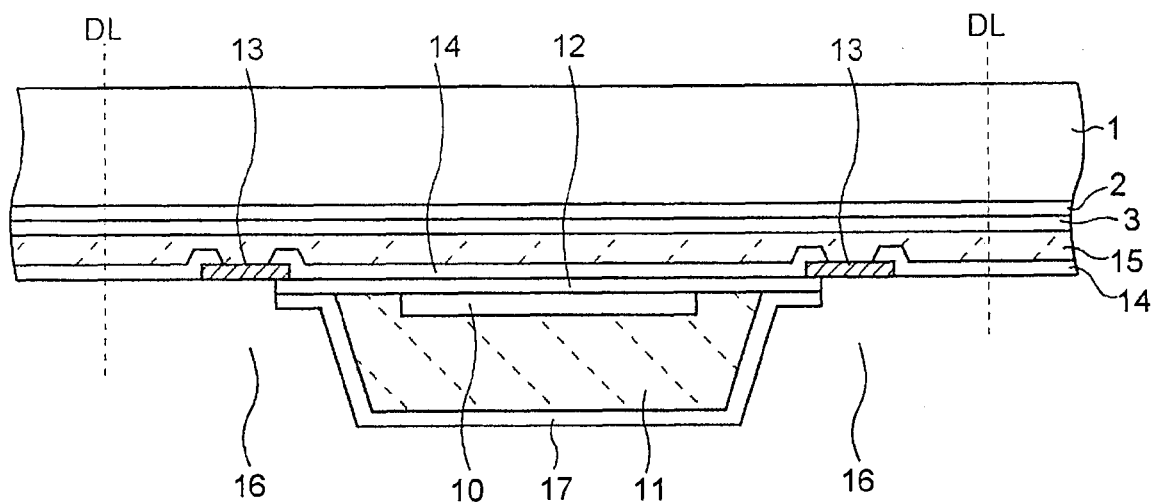
FIGS. 9A and 9B are cross-sectional views for explaining the semiconductor device and the method of manufacturing the same of the first embodiment of the invention.
Figure 9B:
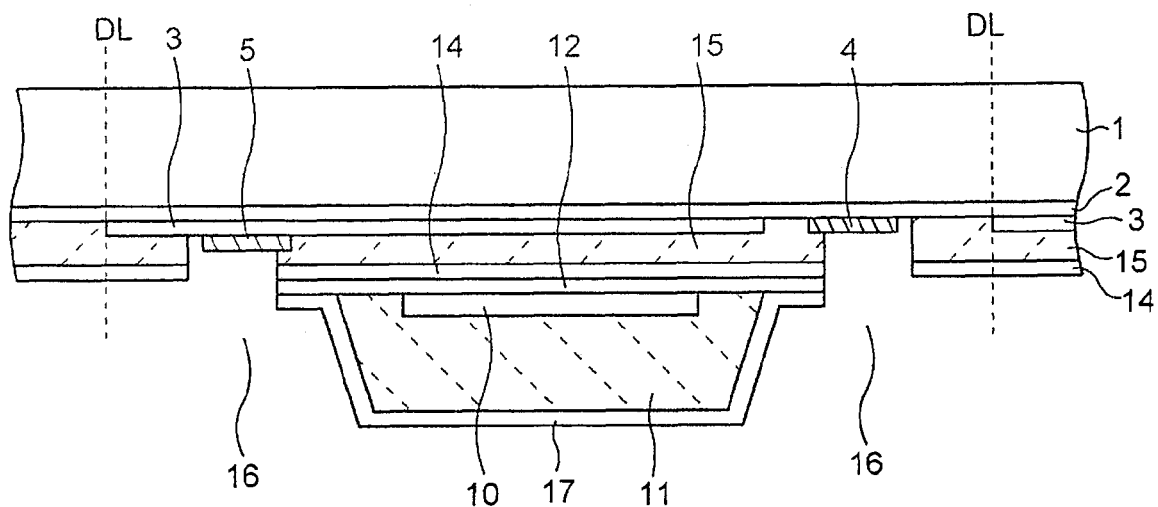

Then, as shown in FIGS. 9A and 9B, a portion of the passivation film 14 and a portion of the adhesive layer 15 on the bottom of the opening 16 are sequentially etched using a resist layer (not shown) as a mask. By this selective etching, a portion of the passivation film 14 and a portion of the adhesive layer 15 on the bottom of the opening 16 are removed to expose a portion of the pad electrodes 4 and 5. In this manner, all of the pad electrodes 4 and 5 on the semiconductor substrate 1 side and the pad electrodes 13 on the semiconductor substrate 11 side are exposed.

Figure 10A:
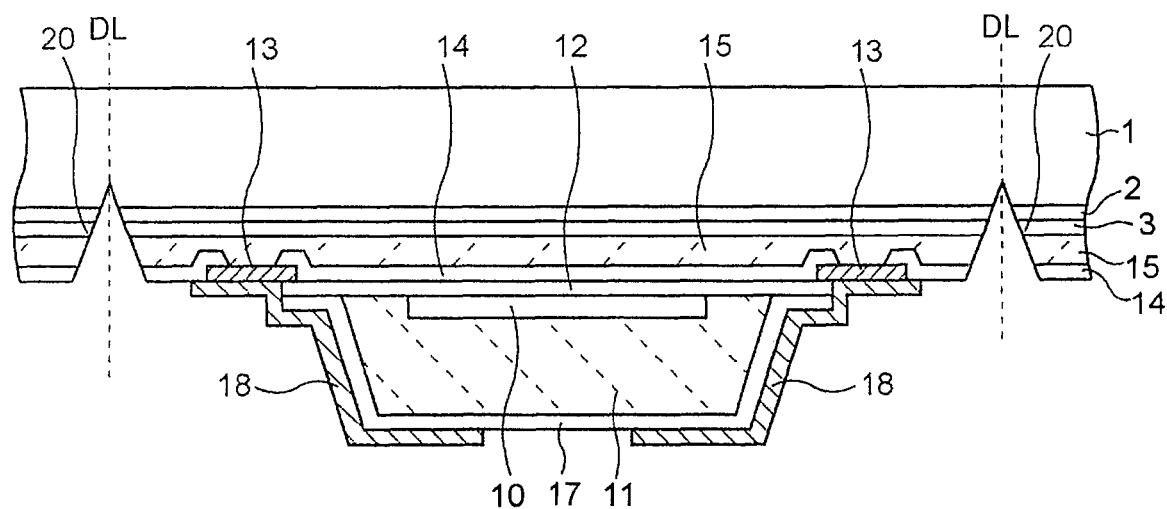
FIGS. 10A and 10B are cross-sectional views for explaining the semiconductor device and the method of manufacturing the same of the first embodiment of the invention.
Figure 10B:
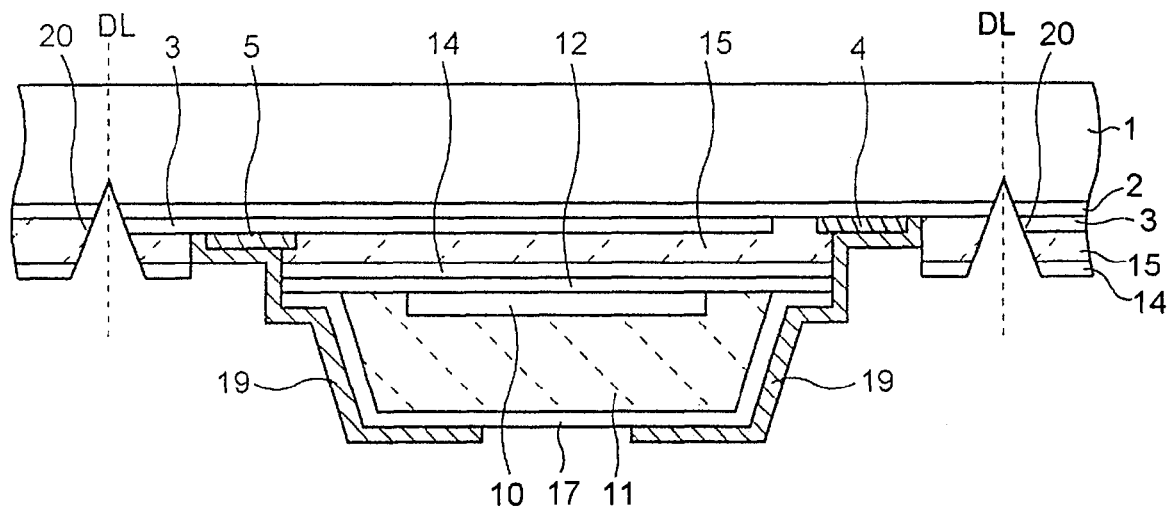

Then, a conductive layer made of aluminum (Al), copper (Cu) or the like for wiring layers 18 and 19 is formed by a sputtering method, a plating method or other film deposition method to have a thickness of, for example, 1 μm. Then, this conductive layer is selectively etched using a resist layer (not shown) as a mask. By this etching, the conductive layer forms the wiring layers 18 and 19 along the side surface of the semiconductor substrate 11 with the second insulation film 17 being interposed therebetween, as shown in FIGS. 10A and 10B. Each of the wiring layers 18 is connected to at least a portion of each of the pad electrodes 13 and extends so as to cover a portion of the back surface of the semiconductor substrate 11, as shown in 10A. Each of the wiring layers 19 is connected to a portion of each of the pad electrodes 4 and 5 and extends so as to cover a portion of the back surface of the semiconductor substrate 11, as shown in FIG. 10B.

Then, the adhesive layer 15 and the semiconductor substrate 1 are partially removed from the semiconductor substrate 11 side using a dicing blade or by an etching to form notch portions 20. The cross-sectional shape of each of the notch portions 20 is not limited to the V-shape as shown in FIGS. 10A and 10B and may be an elliptic shape or almost rectangular shape as long as the notch portions 20 reach the semiconductor substrate 1.

Then, an electrode connection layer (not shown) covering the wiring layers 18 and 19 is formed. The reason for forming the electrode connection layer is that the wiring layers 18 and 19 made of aluminum or the like and the conductive terminals 22 made of solder or the like that will be described below are difficult to attach and the material of the conductive terminals 22 is prevented from flowing in the wiring layers 18 and 19. The electrode connection layer is formed by, for example, a lift-off method where metal layers such as a nickel (Ni) layer and a gold (Au) layer or the like are sequentially sputtered using a resist layer as a mask and then the resist layer is removed or by a plating method.

Figure 11A:
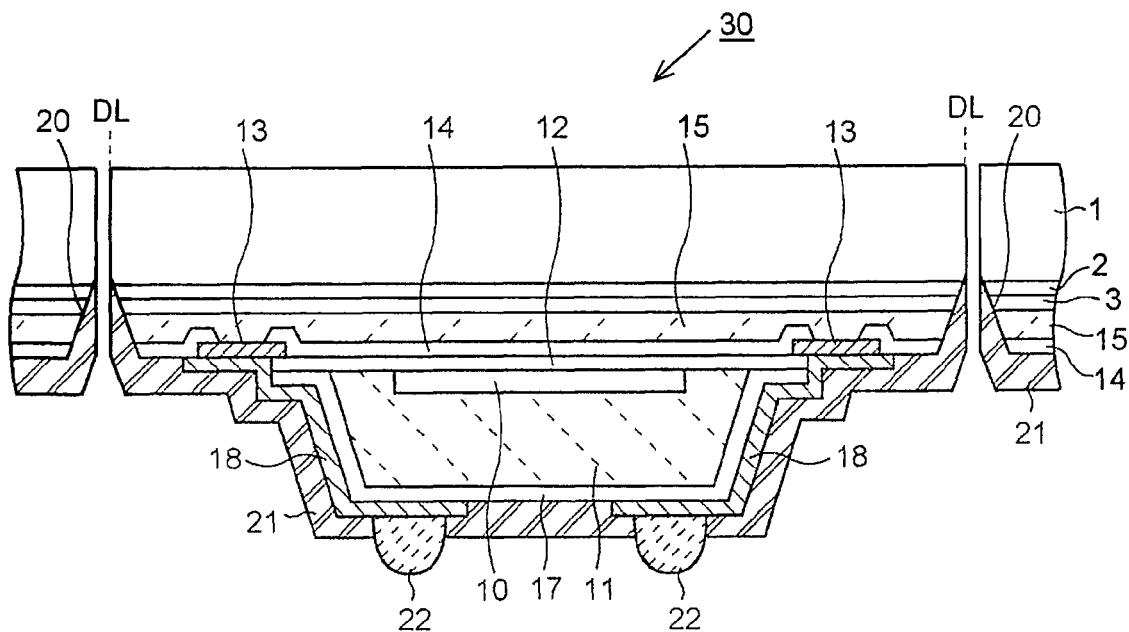
FIGS. 11A and 11B are cross-sectional views for explaining the semiconductor device and the method of manufacturing the same of the first embodiment of the invention.
Figure 11B:
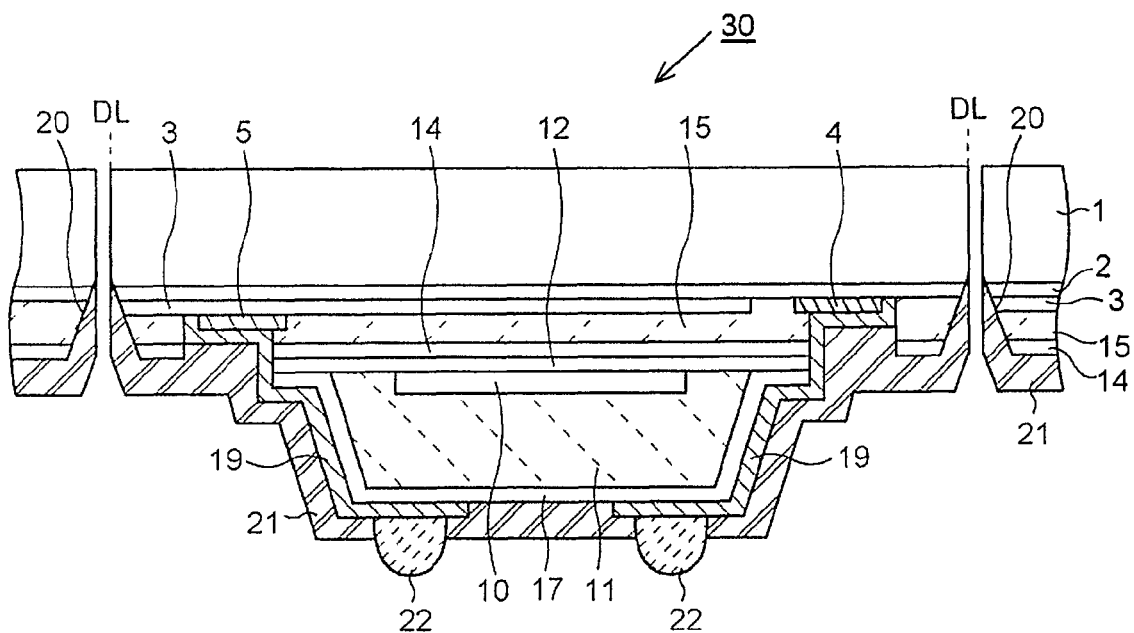

Then, as shown in FIGS. 11A and 11B, a protection layer 21 having a thickness of, for example, 10 μm is formed to have openings in regions for formation of the conductive terminals 22 that will be described below. The protection layer 21 is formed as follows, for example. First, an organic material such as polyimide type resin, a solder resist or the like is applied to the whole surface by a coating method and a heat treatment (pre-bake) is performed thereto. Then, exposure and development are performed to the applied organic material to form openings exposing predetermined regions, and then a heat treatment (post-bake) is performed thereto, thereby providing the protection layer 21 having openings in the regions for formation of the conductive terminals 22. Since the notch portions 20 are formed in this embodiment, the side surface of the semiconductor substrate 1 is partially covered by the protection layer 21. It means that the side surface of the adhesive layer 15 is completely covered by the protection layer 21. Therefore, the adhesive layer 15 is prevented from being exposed to outside air, and corrosive substances (e.g. water) are prevented from infiltrating into the device element 10 and the adhesive layer 15.

Then, a conductive material (e.g. solder) is screen-printed on the electrode connection layers (not shown) exposed in the openings of the protection layer 21, and this conductive material is reflowed by a heat treatment. In this manner, as shown in FIGS. 11A and 11B, the conductive terminals 22 electrically connected to the pad electrodes 4, 5 and 13 through the wiring layers 18 and 19 are formed on the back surface of the semiconductor substrate 11. The method of forming the conductive terminals 22 is not limited to the above, and these may be formed by an electrolytic plating method or a so-called dispensing (coating) method where a solder or the like is applied to a predetermined region with a dispenser. The conductive terminals 22 may be made of gold, copper or nickel, and the material thereof is not particularly limited. The electrode connection layer (not shown) may be formed after the formation of the protection layer 21.

Figure 12:
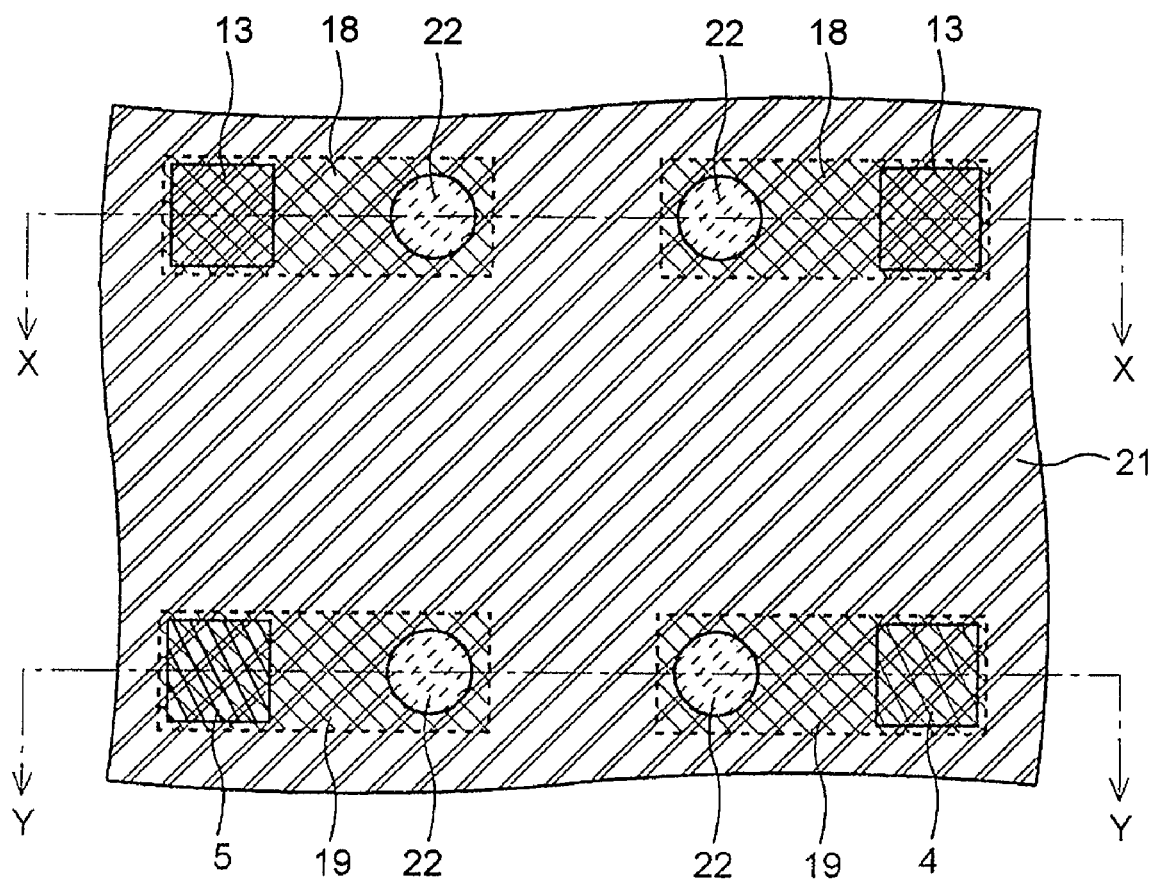
FIG. 12 is a plan view for explaining the semiconductor device and the method of manufacturing the same of the first embodiment of the invention.

Then, the wafer is cut along a dicing line DL and divided into individual semiconductor devices 30. As a method of dividing the wafer into individual semiconductor devices 30, there is a dicing method, an etching method, a laser cutting method or the like. FIG. 12 is a schematic plan view of the semiconductor device 30 on the back surface side (the semiconductor substrate 11 side). FIGS. 11A and 11B showing the semiconductor device 30 correspond to cross-sectional views along line X-X and line Y-Y in FIG. 12, respectively.

By the described processes, the chip size package type photocoupler having both of the light emitting element (the LED) and the light receiving element (the device element 10) on the attached surfaces of the semiconductor substrate 1 and the semiconductor substrate 11 is formed. This photocoupler is mounted on a printed board or the like through the conductive terminals 22.

Figure 15:
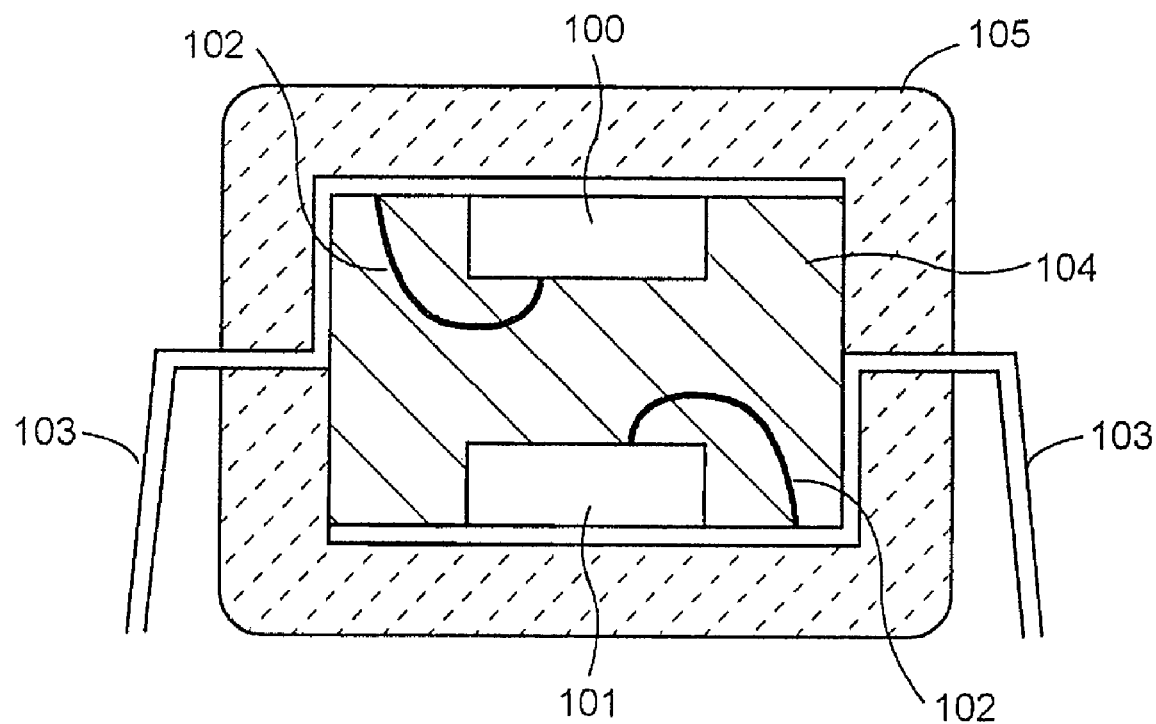
FIG. 15 is a cross-sectional view for explaining a conventional semiconductor device.

Differing from the conventional structure (see FIG. 15), in this embodiment, the light emitting element and the light receiving element are not separately formed in different dies, and these are integrated as a die with the adhesive layer 15 interposed therebetween before the wafer is divided into individual semiconductor devices, that is, in the wafer state. This provides a smaller semiconductor device than conventional.

Furthermore, although two dies are separately completed and then integrated through an assembling work conventionally, such a structure is integrally completed at the time when the wafer is divided into individual semiconductor devices in this embodiment. This simplifies a subsequent assembling work or the like and enhances the workability of the semiconductor device.

Figure 13A:
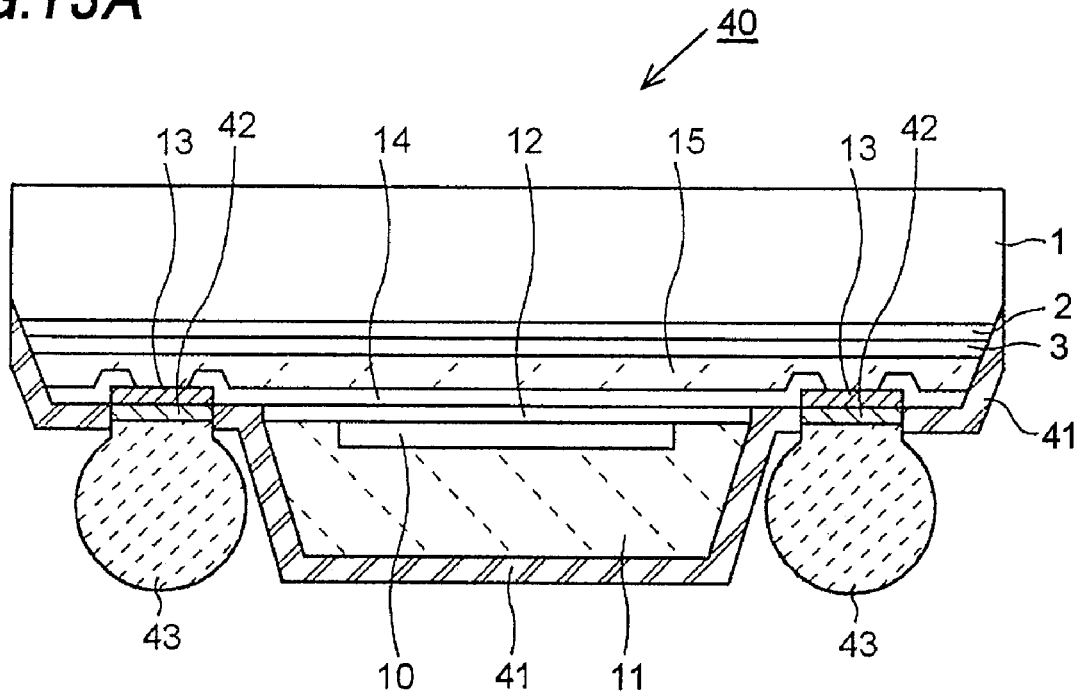
FIGS. 13A and 13B are cross-sectional views for explaining a semiconductor device and a method of manufacturing the same of a second embodiment of the invention.
Figure 13B:
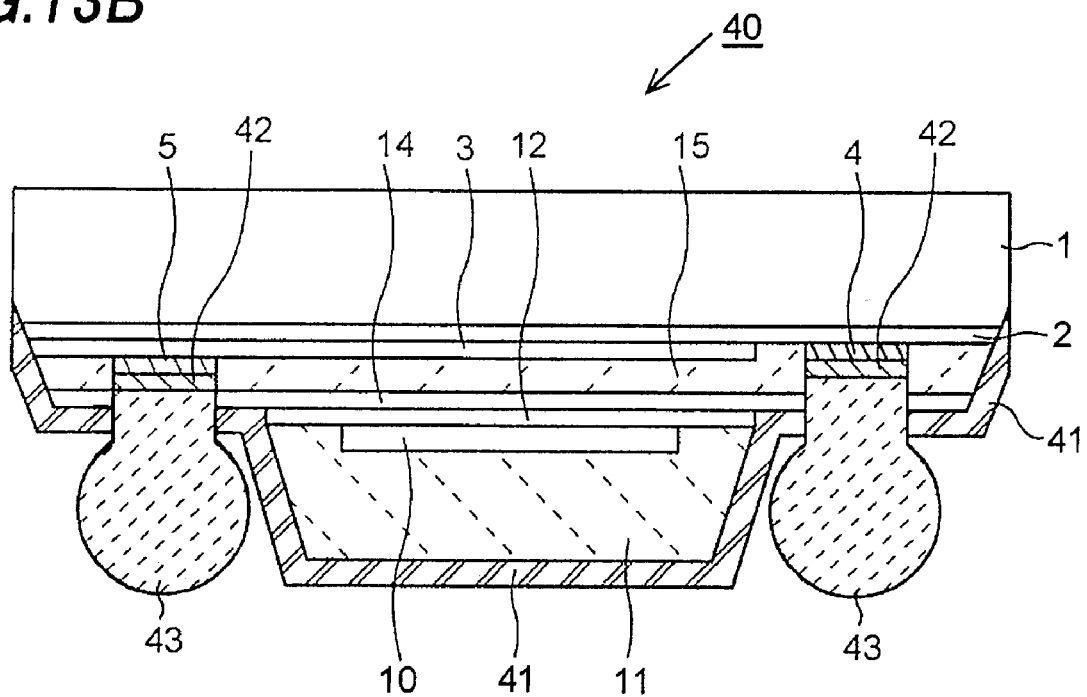

Next, a second embodiment of the invention will be described. FIGS. 13A and 13B are cross-sectional views of a semiconductor device of the second embodiment. In the second embodiment, too, a description will be given using two cross-sectional views in the similar manner to the first embodiment, and the same numerals are given to the same components as those of the first embodiment and a description thereof will be omitted.

A semiconductor device 40 of the second embodiment shown in FIGS. 13A and 13B has an opening in the position corresponding to the pad electrodes 4, 5 and 13, and formed with a protection layer 41 covering the side and back surface of the semiconductor substrate 11. Electrode connection layers 42 are formed on the pad electrodes 4, 5 and 13 in openings of the protection layer 41. The electrode connection layer 42 is a layer of, for example, a nickel (Ni) layer and a gold (Au) layer laminated in this order, and formed by a lift-off method where these metals are sequentially sputtered using a resist layer as a mask and then the resist layer is removed or by a plating method. Conductive terminals 43 made of solder or the like are formed on the pad electrodes 4, 5 and 13 with the electrode connection layers 42 being interposed therebetween. In this manner, the conductive terminals 43 may be located adjacent to the sidewall of the semiconductor substrate 11, without wiring layers (the wiring layers 18 and 19 of the first embodiment) formed on the side and back surface of the semiconductor substrate 11.

The second embodiment does not need a process of forming the wiring layers 18 and 19 and the second insulation film 17 of the semiconductor substrate 11 as shown in the semiconductor device (FIGS. 11A and 11B) of the first embodiment. Therefore, in addition to the effect obtained in the first embodiment, the manufacturing process is simplified and the manufacturing cost is reduced. Furthermore, since the conductive terminals 43 are not formed on the back surface of the semiconductor substrate 11 but formed adjacent to the sidewall of the semiconductor substrate 11 on the outside in the second embodiment, the semiconductor device is thinner than that of the first embodiment.

Figure 14A:
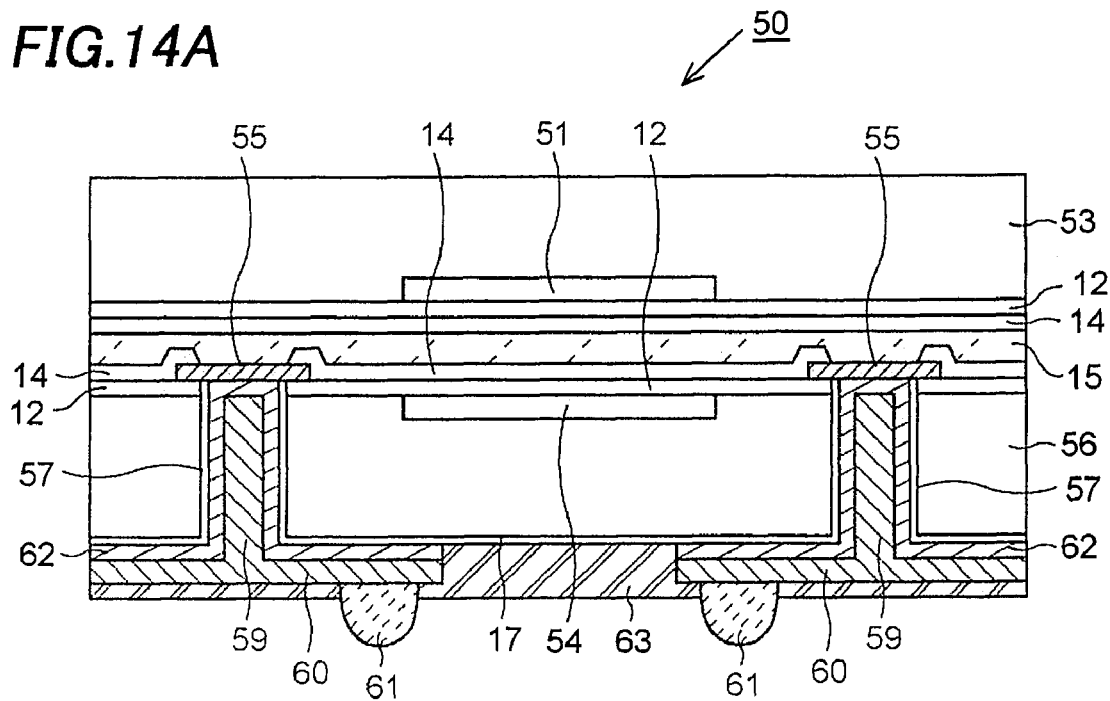
FIGS. 14A and 14B are cross-sectional views for explaining a semiconductor device and a method of manufacturing the same of a third embodiment of the invention.
Figure 14B:
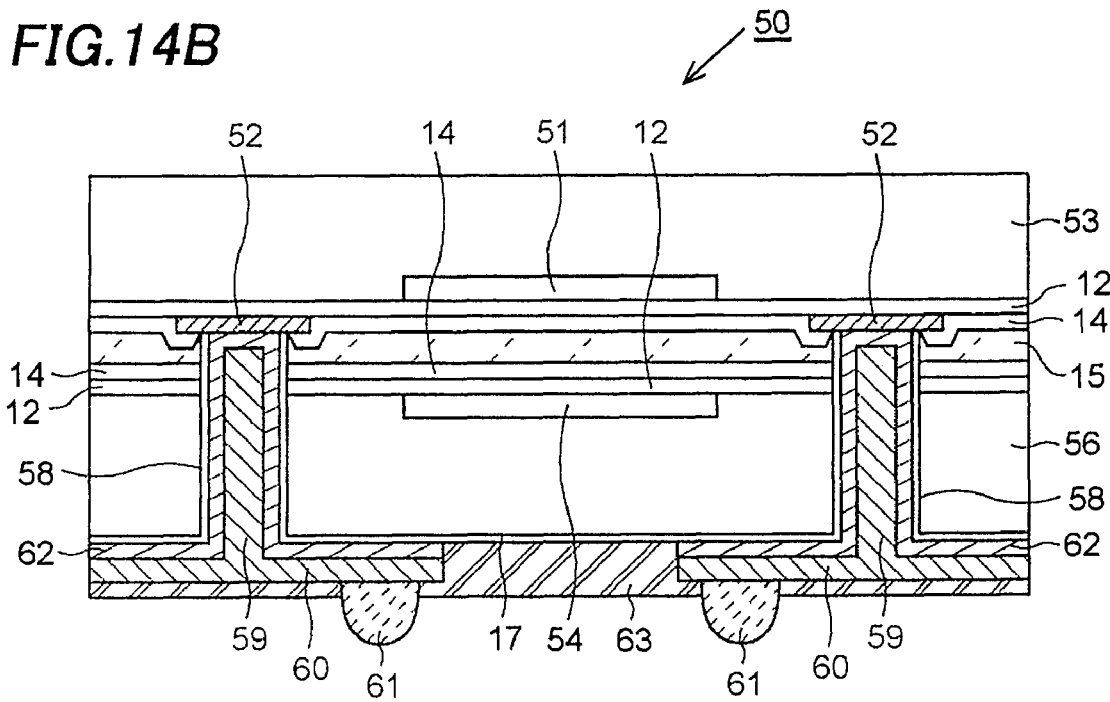

Next, a third embodiment of the invention will be described. FIGS. 14A and 14B are cross-sectional views of a semiconductor device of the third embodiment. A description of this embodiment will be also given using two cross-sectional views in the same manner to the first and second embodiments, the same numerals are given to the same components as those of the described first embodiment, and a description thereof will be omitted.

A semiconductor device 50 of the third embodiment shown in FIGS. 14A and 14B has a semiconductor substrate 53 (a first substrate) formed with a device element 51 on its front surface and pad electrodes 52 electrically connected to this element 51, and a semiconductor substrate 56 (a second substrate) formed with a device element 54 on its front surface and pad electrodes 55 electrically connected to this element 54, in which the front surfaces of the substrates 53 and 56 are attached with the adhesive layer 15 being interposed therebetween.

Furthermore, the semiconductor substrate 56 has first penetration holes 57 penetrating the substrate 56 from its back surface side (the side not formed with the element) to its front surface and reaching the pad electrodes 55, and second penetration holes 58 penetrating the semiconductor substrate 56 and the adhesive layer 15 from its back surface side and reaching the pad electrodes 52. Penetration electrodes 59 of aluminum, copper or the like are formed in the first and second penetration holes 57 and 58, and wiring layers 60 and ball-shaped conductive terminals 61 electrically connected to the penetration electrodes 59 are formed on the back surface of the semiconductor substrate 56. Furthermore, barrier metal layers 62 made of metal such as, for example, a titanium (Ti) layer, a titanium nitride (TiN) layer or a tantalum nitride (TaN) layer are formed between the second insulation film 17 and the penetration electrodes 59 and between the second insulation film 17 and the wiring layers 60.

Such a so-called penetration electrode type semiconductor device is manufactured by the following manufacturing processes, for example. First, the semiconductor substrate 53 formed with the device element 51 and the pad electrodes 52 and the semiconductor substrate 56 formed with the device element 54 and the pad electrodes 55 are prepared. Then, the front surfaces of the semiconductor substrate 53 and the semiconductor substrate 56 are attached with the adhesive layer 15 being interposed therebetween. At this time, the substrates 53 and 56 are attached so that the pad electrodes 52 and the pad electrodes 55 do not overlap in the same manner to the substrates shown in FIG. 4.

Then, the first penetration holes 57 penetrating the semiconductor substrate 56 are formed in the positions corresponding to the pad electrodes 55 to partially expose the pad electrodes 55. Then, the second penetration holes 58 penetrating the semiconductor substrate 56 and the adhesive layer 15 are formed in the positions corresponding to the pad electrodes 52 to partially expose the pad electrodes 52. Then, the second insulation film 17 is formed to cover the sidewalls of these first and second penetration holes 57 and 58 and the back surface of the semiconductor substrate 56. Then, the second insulation film 17 on the bottoms of the first and second penetration holes 57 and 58 is removed to expose the pad electrodes 52 and 55 again, and then the barrier metal layers 62 are formed in the first and second penetration holes 57 and 58. Then, the penetration electrodes 59 and the wiring layers 60 electrically connected with these electrodes 59 are formed in the first and second penetration holes 57 and 58 by, for example, an electrolytic plating method. It is noted that the wiring layer 60 may connect the pad electrode 52 and the pad electrode 55. Then, the electrode connection layer (e.g. a lamination layer of a nickel layer and a gold layer) is formed on the wiring layers 60, and the protection layer 63 made of a solder resist or the like having predetermined openings is formed. Then, the ball-shaped conductive terminals 61 are formed on the electrode connection layer exposed in the openings of the protection layer 63. Then, dicing is performed to the wafer to provide individual semiconductor devices 50. A sequence of these processes is an example of the processes of manufacturing the penetration electrode type semiconductor device.

The first and second embodiments provide such a structure that a power supply voltage is supplied from the wiring layers 18 and 19 (FIGS. 11A and 11B) on the side surface of the semiconductor substrate 11 or the conductive terminals 43 (FIG. 13) adjacent to the sidewall of the semiconductor substrate 11 to the pad electrodes 4, 5 and 13. On the other hand, the third embodiment indicates that the invention is applicable to the so-called penetration electrode type semiconductor device. In this manner, the way of connecting the pad electrodes 4, 5 and 13 to the external power supply is changed as appropriate.

The descriptions of the first and second embodiments are given about the structure where the light emitting element is formed on the semiconductor substrate 1 (the first substrate) side, the light receiving element receiving a light signal from this light emitting element is formed on the semiconductor substrate 11 (the second substrate) side, and both of these elements are integrated as a photocoupler. On the other hand, the third embodiment indicates that the invention is not limitedly applied to the photocoupler having the light emitting element and the light receiving element. It means that the device element 51 and the device element 54 may have the same type of functions or may have different functions and the types of the elements are not limited. For example, both of the device elements 51 and 54 may be storage elements such as DRAM, or either one of these may be a storage element and another may be a driver element controlling reading and writing of this storage element.

Furthermore, in the first and second embodiments, the elements (the light emitting element and the light receiving element) respectively formed on the two substrates are not electrically connected. However, it is also possible to electrically connect the device element 51 and the device element 54 by connecting the pad electrodes 52 and the pad electrodes 55 through a wiring layer. Alternatively, the electrical connection of the elements on the two substrates may be made through a wire on a packaging substrate side.

In the third embodiment, too, the two device elements (51, 54) are not separately provided on individual dies but are integrated in a die. This realizes a smaller semiconductor device than conventional.

Since there is no limitation on the types of the device elements formed on the substrates, sealing these elements in a die is realized even though these elements are not sealed together in a die conventionally or are conventionally difficult to seal in a die together for a reason relating to the manufacturing processes. For example, since MEMS is generally formed at high temperature, its compatibility with the CMOS process or the like is not preferable. The MEMS is a device which integrally packages a mechanical component, a sensor, an actuator, an electronic circuit or the like on a semiconductor substrate. Therefore, it is difficult to form the MEMS and other element (e.g. a drive element for the MEMS) in a die together by the conventional manufacturing processes. However, the invention realizes a desired MEMS device in a die by forming MEMS on one substrate and forming a drive element for the MEMS on another substrate in the same manner to the above-described embodiments.

Furthermore, although a conventional device is formed by separately completing two dies and then performing an assembling work of these dies, such a structure is completed integrally at the time when the wafer is divided into individual semiconductor devices. This simplifies a subsequent assembling work or the like.

Furthermore, in all the embodiments described above, since the device elements are sealed and protected by the two substrates, the reliability of the semiconductor device is enhanced.

It is noted that the invention is not limited to the above-described embodiments and modification is possible within the scope of the invention. For example, although the semiconductor substrates (the semiconductor substrates 1, 11, 53 and 56) are used in the above-described embodiments, the substrates may be made of an insulation material such as glass or quartz instead of a semiconductor. Depending on use of the device, this substrate may be transparent and have a property of transmitting light. The device element formed on the substrate may be a mechanical device such as a MEMS (Micro Electro Mechanical Systems) element as described above.

Furthermore, in the above described embodiments, the wiring layers and the conductive terminals for supplying a voltage are formed on either one of the substrates only. In the first embodiment, the opening 16 is formed on the semiconductor substrate 11 side, and then the wiring layers 18 and 19 and the conductive terminals 22 are formed on this side. However, the invention is not limited to this. According to needs, it is possible to form the wiring layers and the conductive terminals on the opposite substrate, or form the wiring layers and the conductive terminals on both of the substrates. For example, the same openings, the same wiring layers and the same conductive terminals may be formed on the substrate on the light emitting element side (the semiconductor substrate 1).

Furthermore, in the above described embodiments, the two substrates are attached so that the pad electrodes formed on the substrates (e.g. the pad electrodes 4 and 13 in the first embodiment) do not overlap. However, even if both of the pad electrodes overlap, it is possible to supply a voltage to each of the pad electrodes from both sides by forming the openings, the wiring layers and the conductive terminals on the substrate formed with these pad electrodes. In this manner, the way of supplying a voltage to the elements may be changed as appropriate.

Furthermore, although the descriptions of the above embodiments are given about the BGA type semiconductor device having the ball-shaped conductive terminals (22, 43 and 61), the invention is applicable to the LGA (Land Grid Array) type semiconductor device. The invention is widely applicable as a technique of sealing various device elements in a smaller device.

In the embodiments above, the two semiconductor dies are integrated in a wafer state before the wafer is divided into individual semiconductor devices, although the dies are separately formed, and thus a thinner and smaller semiconductor device is realized. Furthermore, this reduces the amount of the subsequent assembling work and so on and enhances the workability of the semiconductor device.

What is claimed is:

1. A semiconductor device, comprising:
   a first substrate comprising a first device element formed on a front surface thereof;
   a second substrate comprising a second device element formed on a front surface thereof;
   a first pad electrode disposed on the front surface of the first substrate and electrically connected to the first device element;
   a second pad electrode disposed on the front surface of the second substrate and electrically connected to the second device element; and
   an adhesive layer disposed between the front surface of the first substrate and the front surface of the second substrate so that the first and second substrates are adhered together to form an integrated die,
   wherein, in plan view of the semiconductor device, the first pad electrode does not overlap any pad electrode formed on the front surface of the second substrate, and the second pad electrode does not overlap any pad electrode formed on the front surface of the first substrate.

2. The semiconductor device of claim 1, further comprising a first conductive terminal electrically connected to the first pad electrode and a second conductive terminal electrically connected to the second pad electrode, the first and the second conductive terminals extending in a direction normal to the front surfaces of the first and second substrates.

3. The semiconductor device of claim 1, further comprising a first wiring layer electrically connected to the first pad electrode and a second wiring layer electrically connected to the second pad electrode, the first and the second wiring layers being disposed on side surfaces of the second substrate.

4. The semiconductor device of claim 3, wherein the first and the second wiring layers extend to cover a back surface of the second substrate.

5. The semiconductor device of claim 1, further comprising penetration holes penetrating the second substrate and filled with a conductive member, the first and second pad electrodes being configured to be electrically connected to an external power supply through the filled penetration holes.

6. The semiconductor device of claim 1, wherein part of the adhesive layer is removed above the first pad electrode so as to accommodate a conductive member for external power connection to the first pad electrode.

7. The semiconductor device of claim 1, wherein the first device element comprises a light emitting element, and the second device element comprises a light receiving element receiving light from the light emitting element.

8. The semiconductor device of claim 1, wherein the first device element or the second device element comprises a MEMS element.

9. The semiconductor device of claim 1, wherein the first pad electrode is electrically separated from the second pad electrode.

* * * * *